US009917052B2

(12) United States Patent
Cheng et al.

(10) Patent No.: US 9,917,052 B2
(45) Date of Patent: Mar. 13, 2018

(54) METHOD OF FABRICATING ANTI-FUSE FOR SILICON ON INSULATOR DEVICES

(71) Applicant: International Business Machines Corporation, Armonk, NY (US)

(72) Inventors: Kangguo Cheng, Schenectady, NY (US); Ali Khakifirooz, Los Altos, CA (US); Juntao Li, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/951,999

(22) Filed: Nov. 25, 2015

(65) Prior Publication Data
US 2017/0148733 A1 May 25, 2017

(51) Int. Cl.
*H01L 21/44* (2006.01)
*H01L 23/525* (2006.01)
*H01L 21/311* (2006.01)
*H01L 21/308* (2006.01)
*H01L 21/306* (2006.01)

(52) U.S. Cl.
CPC ...... *H01L 23/5252* (2013.01); *H01L 21/3086* (2013.01); *H01L 21/30608* (2013.01); *H01L 21/31116* (2013.01); *H01L 21/31144* (2013.01)

(58) Field of Classification Search
CPC combination set(s) only.
See application file for complete search history.

(56) References Cited

U.S. PATENT DOCUMENTS

| 6,396,121 | B1 | 5/2002 | Bertin et al. |
| 6,933,591 | B1 | 8/2005 | Sidhu et al. |
| 7,638,855 | B2 | 12/2009 | Lung |
| 8,080,443 | B2 * | 12/2011 | Chen ............ H01L 21/0337 257/E21.038 |
| 9,093,453 | B2 | 7/2015 | Li et al. |
| 9,099,538 | B2 * | 8/2015 | Shih ............ H01L 21/76883 |

(Continued)

OTHER PUBLICATIONS

Cheng, Kagguo, et al., "Method of Fabricating Anti-Fuse for Silicon on Insulator Devices", U.S. Appl. No. 15/403,608, filed Jan. 11, 2017.

(Continued)

*Primary Examiner* — Telly Green
(74) *Attorney, Agent, or Firm* — Cantor Colburn LLP; Jennifer Anda

(57) ABSTRACT

A method includes depositing a first hard mask layer on a first substrate; lithographically patterning and etching the first substrate to form a semiconductor link connected to an anode semiconductor region and a cathode semiconductor region; removing the first hard mask layer from the first substrate; depositing a second hard mask layer on the first substrate; patterning a photoresist on the first substrate and etching to form an opening in the semiconductor link; etching to remove portions of the second hard mask layer to expose a portion of a sidewall of the semiconductor link; removing the photoresist from the first substrate and the semiconductor link; and recessing the sidewalls of the semiconductor link forming first anti-fuse tip and second anti-fuse tip to form an anti-fuse with an opening between the first and second anti-fuse tips.

20 Claims, 5 Drawing Sheets

(56) References Cited

U.S. PATENT DOCUMENTS

| | | | |
|---|---|---|---|
| 2005/0133882 A1* | 6/2005 | Young | H01L 23/5256 257/529 |
| 2006/0102982 A1* | 5/2006 | Park | H01L 23/5252 257/528 |
| 2009/0051003 A1 | 2/2009 | Cheng et al. | |
| 2010/0167502 A1* | 7/2010 | Yen | H01L 21/0337 438/478 |
| 2011/0221031 A1* | 9/2011 | Drizlikh | H01L 23/5252 257/530 |
| 2012/0061797 A1 | 3/2012 | Kanda | |
| 2015/0097266 A1 | 4/2015 | Li et al. | |

OTHER PUBLICATIONS

List of IBM Patents or Patent Applications Treated as Related; (Appendix P), Filed Jan. 11, 2017, 2 pages.

\* cited by examiner

METHOD OF FABRICATING ANTI-FUSE FOR SILICON ON INSULATOR DEVICES

BACKGROUND

The present invention relates to a semiconductor device, and more specifically, to an anti-fuse for use in a semiconductor device.

Anti-fuses are used in the semiconductor industry for memory related applications such as field programmable gate arrays and programmable read-only memories. Most existing anti-fuses have a layer of anti-fuse material sandwiched in between two disconnected conductive materials. In such structures, the anti-fuse/circuit initially has a very high resistance, but after programming by electrical or optical means, the high resistance structure/circuit is converted to a lower resistance state. Anti-fuses generally include a material with a high resistance that can be converted into a lower resistance by the application of various optical or electrical means. An un-programmed anti-fuse gate array can be programmed by causing a selected anti-fuse to become conductive.

Many processes for integrating anti-fuses within an interconnect structure require many extra masking and etching steps which increase the overall cost of fabricating an integrated circuit. Therefore, a cost effective means for integrating an anti-fuse within an interconnect structure is needed which does not require any extra masking and etching steps. Further, anti-fuse dimensions can be limited by allowable photolithographic dimensions. Thus, it can be desirable to provide anti-fuses not limited by allowable photolithographic dimensions.

SUMMARY

According to an embodiment of the present invention, a method includes depositing a first hard mask layer on a first substrate; lithographically patterning and etching the first substrate to form a semiconductor link connected to an anode semiconductor region and a cathode semiconductor region; removing the first hard mask layer from the first substrate; depositing a second hard mask layer on the first substrate; patterning a photoresist on the first substrate and etching to form an opening in the semiconductor link; etching to remove portions of the second hard mask layer to expose a portion of a sidewall of the semiconductor link; removing the photoresist from the first substrate and the semiconductor link; and recessing the sidewalls of the semiconductor link forming first anti-fuse tip and second anti-fuse tip to form an anti-fuse with an opening between the first and second anti-fuse tips.

According to an embodiment of the present invention, an anti-fuse includes a substrate; an anode semiconductor region arranged on the substrate; a cathode semiconductor region arranged on the substrate; a semiconductor link having a first portion having a proximal end connected to the anode semiconductor region and a distal end having a first anti-fuse tip and a second portion having a proximal end connected to the cathode semiconductor region and a distal end having a second anti-fuse tip; and a gap partially defined by the first anti-fuse tip and the second anti-fuse tip.

DETAILED DESCRIPTION

Electrical anti-fuses can be used in the semiconductor industry to implement array redundancy, field programmable arrays, analog component trimming circuits, and chip identification circuits. Programming an electrical anti-fuse can utilize a substantial amount of voltage, which can be undesirable. Furthermore, a programming transistor can occupy space in a semiconductor chip and power consumption and anti-fuse dimensions can be limited by allowable photolithographic dimensions. The limitations of the allowable photolithographic dimensions can be overcome with the presently claimed process and structure, which can set values for a semiconductor on insulator component present in an anti-fuse that can allow the opening (e.g., gap) between semiconductor links and size of semiconductor links to be adjusted to allow sizes greater than the maximum photolithographic dimensions.

Figure 1:
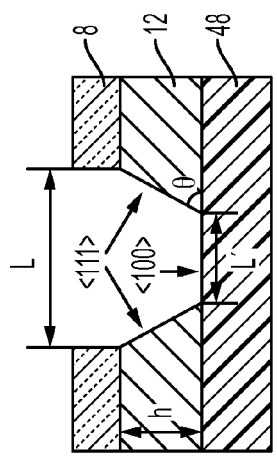
FIG. 1 is a cross-sectional illustration showing how adjusting variables of the layers can affect the dimensions from the anisotropic wet etch process.
Figure 2:
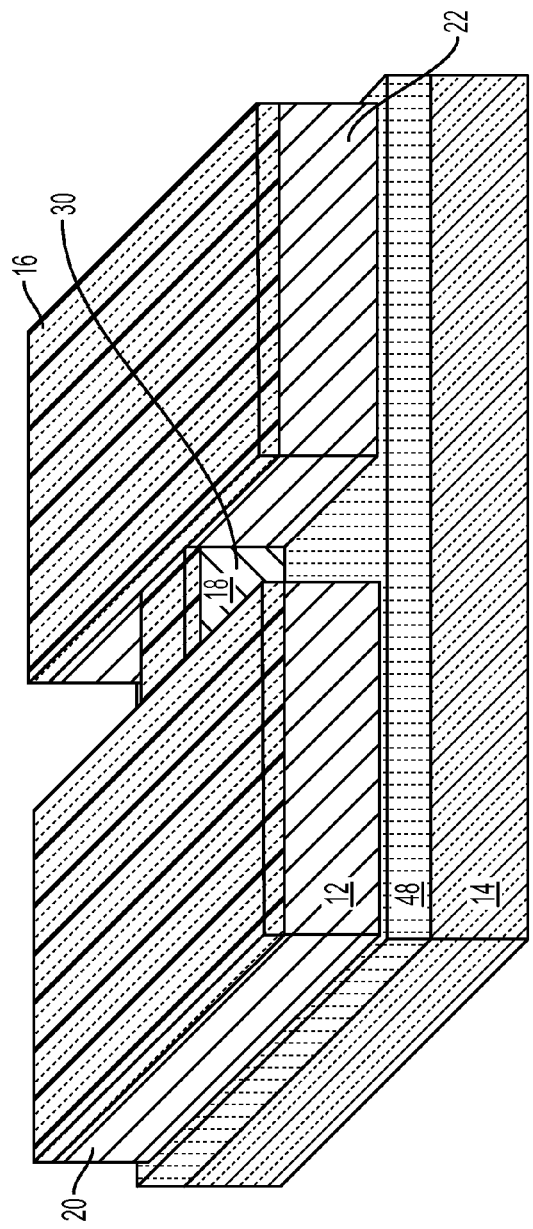
FIG. 2 is an isometric view of an anti-fuse after lithographic patterning and etching to form a semiconductor link.
Figure 3:
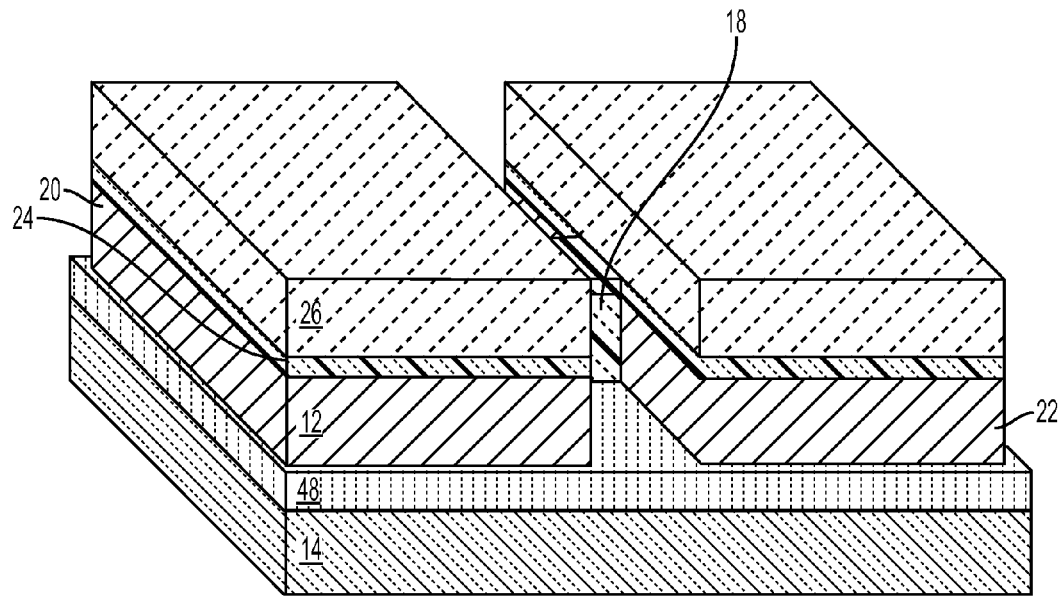
FIG. 3 is an isometric view of an anti-fuse after a second hard mask is deposited.
Figure 4:
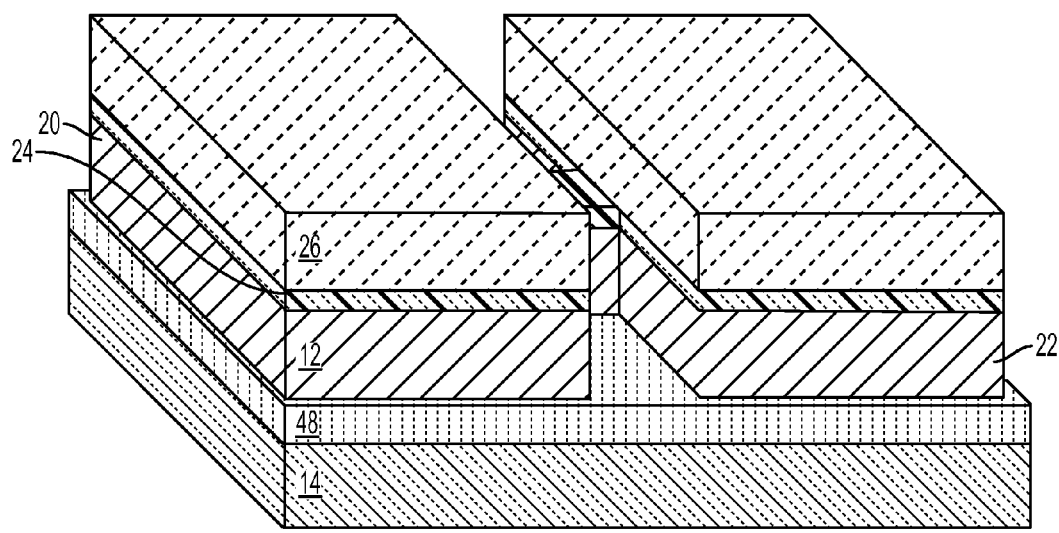
FIG. 4 is an isometric view of an anti-fuse after reactive etching.

With reference now to FIG. 1, an exemplary anisotropic etch is illustrated. In FIG. 1, a first substrate 12, e.g., a semiconductor on insulator (SOI) substrate is dispersed between a hard mask layer 8 and a buried oxide (BOX) layer 48. Optionally, a second substrate 14 (see e.g., FIG. 2) can be disposed adjacent to the buried oxide layer 48. As illustrated in FIG. 1, L', which is the length of opening 30 (e.g., gap 30) at buried oxide layer 48 can be smaller than the lithographically limited size L, which is the length of opening 30 at hard mask layer 8. This is possible by controlling the dimensions of a cavity formed by the anisotropic etch. For example, dimensions such as first substrate thickness, first substrate height, h, and length, L can be controlled according to formula (1):

$$L' + 2*h*ctg\ \theta = L \qquad (1)$$

where ctg θ is equal to 54.7°.

For example, etching with an oxide, such as potassium hydroxide (KOH), can achieve selectivity of 400 between plane <100> (horizontal) and plane <111> (vertical). Generally a selective etch refers to the type of etch and/or etch parameters (chemicals, pressures, temperatures, etc.) resulting in an etch that is selective to only removing exposed portions of a particular material. In other words, the etch can be performed selective to oxide so that only oxide is removed and silicon remains, or only polysilicon can be etched but amorphous silicon is not etched. FIG. 1 demonstrates that the final dimensions from an anisotropic wet etching process can be affected by initial structure dimensions including film thickness, lithographic opening width, etc. For the anisotropic etch, potassium hydroxide (KOH) etches the open area in first substrate 12, which is the Si 100 plane, and forms faceted crystallographic planes {111} on the sidewalls. During this anisotropic wet etching process, different crystal planes have drastic differences in etch rate. For example, the etch rate for the {100} plane, the original silicon Si surface, is much faster (e.g., greater than 100 times faster) than that for {111} planes formed by the facets. So when the {111} family crystallographic planes intersect, the etch rate will drop dramatically and the planes become a self-limiting etch stop. By over etching, sharp tips and a gap can be formed, as will be described in detail herein.

Turning now to FIGS. 2 to 7, a method of forming anti-fuse tips is shown. For example, in FIG. 2 a first substrate 12 and first hard mask layer 16 (see FIG. 2 for the first hard mask layer 16) can be lithographically patterned and etched to form a semiconductor link 18. The first hard mask layer 16 can prevent silicon on insulator (SOI) from being etched off the top during the etching process. The semiconductor link 18 can include an anode semiconductor region 20 and a cathode semiconductor region 22. After the semiconductor link 18 is formed, the first hard mask layer 16 can be removed from the first substrate 12. A second hard mask layer 24 (e.g., silicon nitride) can be deposited to the first substrate 12 and to the semiconductor link 18. The second hard mask layer 24 would blanket all of the exposed portions of a wafer post etch. The hard mask layers are used to protect the underlying layers during an etch process. In the embodiment disclosed in FIGS. 2 to 6, the second hard mask layer 24 is a protector to the subsequent etching that forms an opening in the semiconductor link 18.

A photoresist 26 can be patterned onto the first substrate 12 and leave the link 18 exposed. The resist is usually an organic material that is exposed to a pattern of light similar to photographic development, which leaves a patterned layer of organic material on the surface that will be etched. The resist covers portions of the underlying surface(s) that are not desired to be etched. Then an etch process that removes the exposed surfaces is performed. After the photoresist 26 is formed, an anisotropic etch such as, for example, a reactive ion etch (RIE) can be performed to pull down the second hard mask layer 24 to the semiconductor link 18. The directional RIE process will remove the nitride film on both sidewalls (e.g., sidewalls 30) of the semiconductor link 18 and leave a nitride cap on top (see FIGS. 3 and 4 for this process). The remaining nitride cap on the semiconductor link 18 can assist in protecting the top SOI from the following wet etching process (e.g., ammonia wet etching process).

The photoresist 26 can then be stripped from the first substrate 12. The sidewalls 30 of the semiconductor link 18 can be recessed to form first anti-fuse tip 32 and second anti-fuse tip 34. The recessing of the sidewalls 30 can be accomplished with an anisotropic wet etch in order to recess silicon from the exposed semiconductor link sidewalls 30. The crystal orientation of the semiconductor link 18 can be determined by the original silicon substrate crystal orientation in conjunction with the orientation of silicon link after patterning. For example, in FIG. 4, the angle theta is 54.7 degrees after ammonia etching when the starting silicon wafer is a standard (001) wafer and silicon link sidewall is (100) after pillar formation, but before ammonia etch. Thus, the orientation of the crystalline structure of the wafer and the silicon layer deposited on the insulator layer can be ascertained prior to patterning.

Figure 5A:
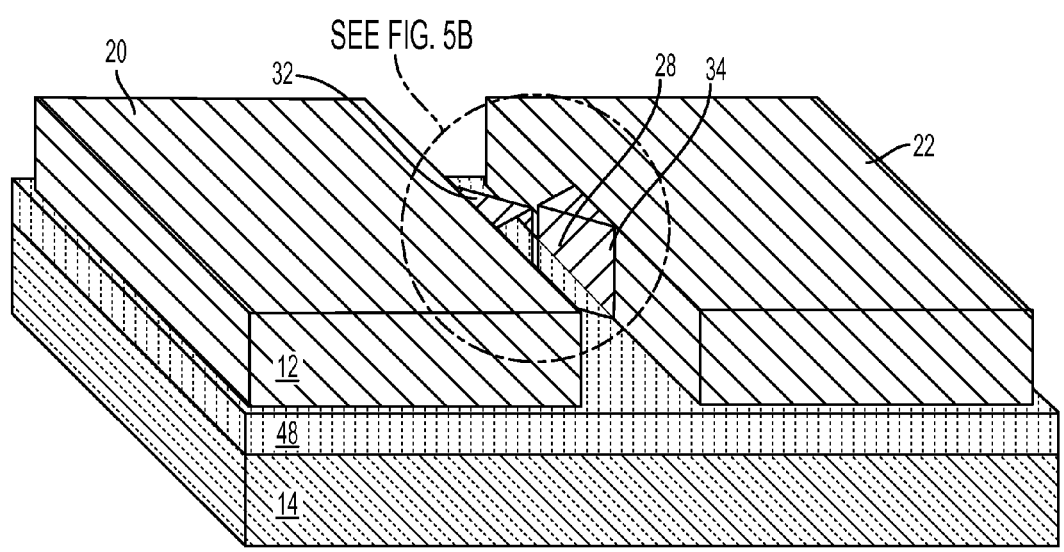
FIG. 5A is an isometric view of the anti-fuse after formation of anti-fuse tips having a triangular shape.
Figure 5B:
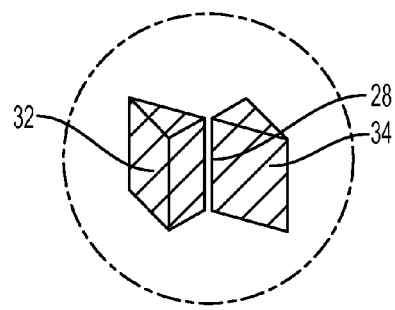
FIG. 5B is an isometric view of the anti-fuse tips shown in FIG. 5A.

During this anisotropic wet etching process, different crystal planes can have drastic differences in etch rate. For example, the etch rate for the {100} plane, the original silicon link sidewall, is much faster (e.g., greater than 100×) than that for {111} planes formed by the facets. So when the {111} family crystallographic planes intersect, the etch rate will drop dramatically. In an embodiment, continuous over etching will eventually form two triangular tips as shown in FIGS. 5A and 5B. An opening 28e can located between the first anti-fuse tip 32 and the second anti-fuse tip 34.

Figure 6A:
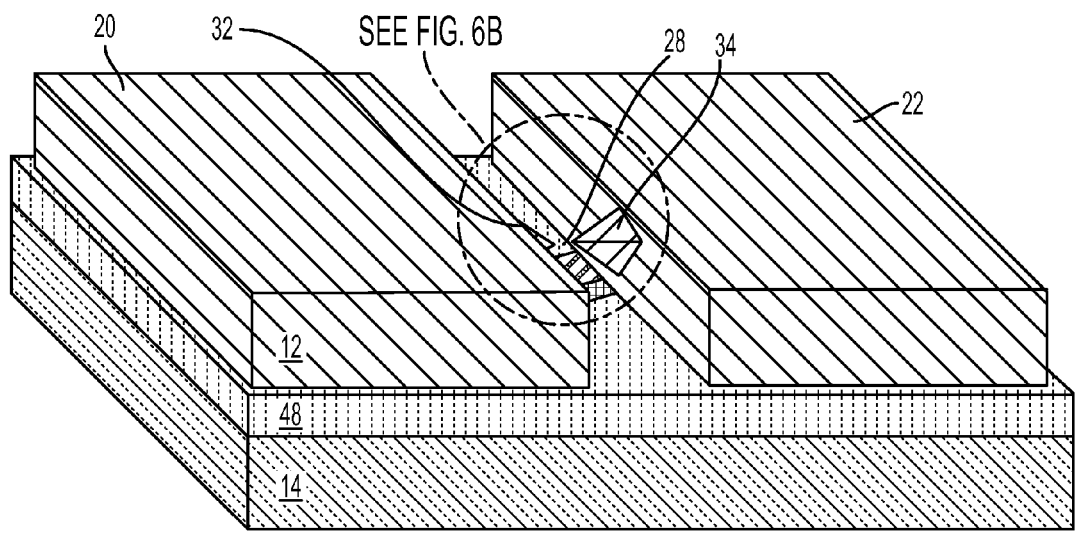
FIG. 6A is an isometric view of an anti-fuse after formation of anti-fuse tips having a pyramidal shape.
Figure 6B:
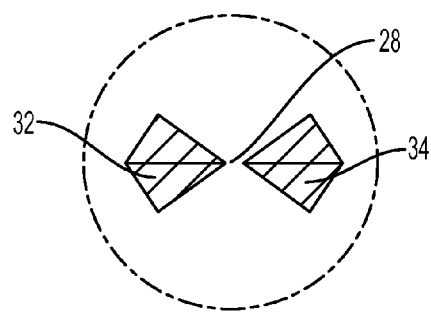
FIG. 6B is an isometric view of the anti-fuse tips shown in FIG. 6A.
Figure 7:
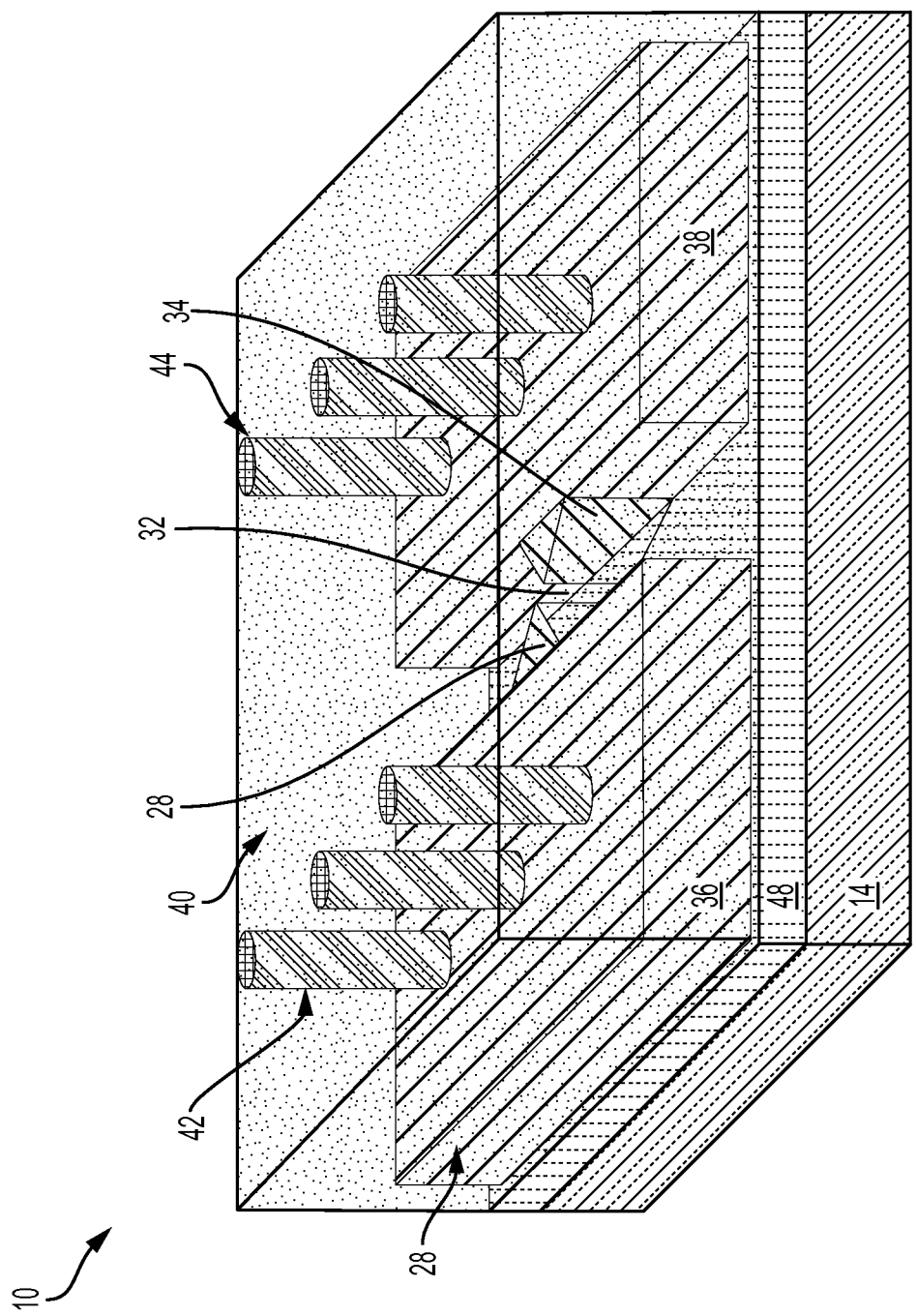
FIG. 7 is an isometric view of an anti-fuse with the alloy anode and alloy cathode connected.

In another embodiment, the semiconductor link 18 has a square cross section (e.g., height=width), then a selective oxide etch can be used to remove oxide under the link region while the top nitride cap is still there. The nitride cap layer can then be removed and the semiconductor link 18 suspended and anchored by the first substrate 12 acting as two pads 20, 22 on either side of the semiconductor link 18. In this embodiment, when an anisotropic etch (e.g., an ammonia anisotropic etch) is performed, a pyramidal shape tip can be formed as seen in FIGS. 6A and 6B. In this case, the recessing will occur simultaneously at the four exposed 100 planes. So eventually a pair of pyramidal shape tips will emerge. After formation of the first anti-fuse tip 32 and the second anti-fuse tip 34, the second hard mask layer 24 can be removed from the substrate 12. After removal of the second hard mask layer 24, an anti-fuse 10 is formed with an opening 28 located between the first anti-fuse tip 32 and the second anti-fuse tip 34.

The opening 28 can have a width of less than or equal to 10 nanometers (nm), for example, less than or equal to 5 nm, for example, less than or equal to 3 nm, for example, less than or equal to 2 nm, for example, 1 to 10 nm, for example, 2 to 5 nm, for example, 2 to 3 nm.

The method can further include depositing a metal semiconductor alloy forming metal layer (not shown) onto the first substrate to form silicide by reacting with the material of the semiconductor link 18 and two pads 20 and 22. Silicide technology is used in the microelectronics industry to form electrical contacts between the semiconductor device and the supporting interconnect structure. The process involves the reaction of a thin metal semiconductor alloy forming a metal film with silicon in the active regions of the device, ultimately forming a metal semiconductor alloy contact through a series of annealing and/or etch processes.

The term "metal semiconductor alloy forming metal" is used in the present application to denote a metal that can react with an underlying semiconductor material to form a metal semiconductor alloy. Illustrative examples of metal semiconductor alloy forming metals that can be used in the present application include at least one of nickel (Ni), platinum (Pt), palladium (Pd), titanium (Ti), tungsten (W), and cobalt (Co). The metal semiconductor alloy forming metal can be formed by a deposition process including, for example, chemical vapor deposition, plasma enhanced chemical vapor deposition, plating or sputtering. In some embodiments, a co-deposition of metal semiconductor alloy forming metals can be used. In another embodiment, a first metal semiconductor alloy forming metal can be formed, followed by a second metal semiconductor alloy forming metal. The metal semiconductor alloy metal that is formed can have a thickness from 2 to 20 nanometers (nm). Other thicknesses that are greater than or lesser than the aforementioned thickness range can also be employed as the thickness of the metal semiconductor alloy forming metal. An anneal is performed under conditions that are effective in causing the metal semiconductor alloy forming metal to diffuse into the semiconductor and react with the semiconductor material to provide a metal semiconductor alloy. In one embodiment, the metal semiconductor alloy comprises a metal silicide such as, for example, nickel silicide or platinum-nickel silicide.

The metal semiconductor alloy formation anneal can be performed in a single step or a two-step anneal can be used. In an embodiment when nickel is used, the metal semiconductor alloy formation anneal can be performed at a temperature of 200° C. to 500° C. In another embodiment, temperatures greater than 500° C. can be used. The metal semiconductor alloy formation anneal is generally performed in an ambient environment including, for example, argon, helium, neon and/or nitrogen. The metal semiconductor alloy formation anneal can be performed utilizing a rapid thermal anneal, a spike anneal, a microwave anneal, or a laser anneal. Following the metal semiconductor alloy formation anneal, any unreacted metal semiconductor alloy forming metal can be removed utilizing one or more etch processes.

When a voltage is applied to the anti-fuse device 10, current flows across the opening 28 and forms a connected electrical circuit. The electrical field at the first anti-fuse tip 32 and the second anti-fuse tip 34 can be relatively high, such that dielectrics can be broken down and a resistance reduction can be induced. In an embodiment, a dielectric layer 40, pattern contact via holes, and fill metal can be deposited onto the silicon silicide alloy layer 36 to form first metal contact 42 and second metal contact 44 (see FIG. 6). The metal contacts 46 can be configured to connect the anode region 36 and the cathode semiconductor region 38.

The anti-fuse 10 can include a buried oxide layer 48 adjacent to the first substrate 12. The anti-fuse 10 can further include a second substrate 14 disposed adjacent to the buried oxide layer 48.

The first substrate 12 and/or second substrate 14 can comprise a semiconducting material, an insulating material, a conductive material, or a combination comprising at least one of the foregoing. When the first substrate 12 and/or second substrate 14 are comprised of a semiconducting material, any semiconducting material such as Si, SiGe, SiGeC, SiC, Ge alloys, GaAs, InAs, InP and other III/V or II/VI compound semiconductors can be used. In addition to these listed types of semiconducting materials, the present disclosure also contemplates cases in which the first substrate 12 and/or second substrate 14 is a layered semiconductor such as, for example, Si/SiGe, Si/SiC, semiconductor on insulators (SOIs). When the first substrate 12 and/or second substrate 14 comprise a semiconducting material, one or more semiconductor devices such as, for example, complementary metal oxide semiconductor (CMOS) devices can be fabricated thereon. Non-limiting examples of first substrate 12 and/or second substrate 14 materials include Si (silicon), strained Si, SiC (silicon carbide), Ge (germanium), SiGe (silicon germanium), SiGeC (silicon-germanium-carbon), Si alloys, Ge alloys, GaAs (gallium arsenide), InAs (indium arsenide), InP (indium phosphide), SOI (semiconductor on insulator), or a combination comprising at least one of the foregoing.

The thickness of the first substrate 12 and/or the second substrate 14 generally varies and is not intended to be limited. In one aspect, the thickness of the first substrate 12 and/or the second substrate 14 is in about 50 micrometers to about 2,000 micrometers.

The buried oxide (BOX) layer 48 is disposed over the second substrate 14. The BOX layer 48 is an oxide, for example silicon dioxide, or a nitride, for example, silicon nitride. The thickness of BOX layer 48 generally varies and is not intended to be limited. In one aspect, the thickness of the BOX layer 48 is in about 10 nm to about 1000 nm.

In an embodiment, the first substrate 12 is semiconductor on insulator (SOI). The SOI is a semiconducting material that includes silicon or silicon germanium. The thickness of the first substrate 12 generally varies and is not intended to be limited. In one aspect, the thickness of the first substrate 12 is in about 10 nm to about 1000 nm. In another aspect, the thickness of the first substrate 12 is about 30 nm to about 100 nm.

Depending on the type of device to be formed, the first substrate 12, when comprising SOI can include more than one type of material, for example, semiconducting materials. In an exemplary embodiment, the SOI 103 includes silicon for forming an NFET and silicon germanium for forming a PFET. In other exemplary embodiments, the SOI 103 includes one type of material, for example, silicon for forming NFETS or silicon germanium for forming PFETs In one embodiment, the first hard mask layer 16 and/or the second hard mask layer 24 can include an oxide, a nitride, an oxynitride or any multilayered combination thereof. In one embodiment, the hard mask is an oxide such as silicon dioxide, while in another embodiment the hard mask is a nitride such as silicon nitride. The hard mask can be formed utilizing a conventional deposition process including, for example, chemical vapor deposition (CVD), plasma enhanced chemical vapor deposition (PECVD), chemical solution deposition, evaporation, and physical vapor deposition (PVD). Alternatively, the hard mask can be formed by one of thermal oxidation, and thermal nitridation.

When employed, the thickness of the first hard mask layer 16 and/or the second hard mask layer 24 can be 5 nm to 100 nm. Other thicknesses that are greater than or lesser than the thickness mentioned above can also be employed for the first hard mask layer 16 and/or the second hard mask layer 24. When a hard mask is present, a first etch is performed to transfer the pattern provided in the photoresist to the hard mask, the patterned photoresist is then removed by an ashing step, and thereafter, a second etch is performed to transfer the pattern from the patterned hard mask into the underlying interconnect dielectric material 12. In embodiments in which a hard mask is present, the hard mask can be removed from atop the first substrate 12.

Dielectric layer 40 can include any interlevel or intralevel dielectric including inorganic dielectrics or organic dielectrics. In one embodiment, the dielectric layer 40 can be non-porous. In another embodiment, the dielectric layer 40 can be porous. Porous dielectrics are advantageous since such dielectric materials have lower dielectric constants than an equivalent non-porous dielectric material. Some examples of dielectrics that can be used as the dielectric layer 40 include, but are not limited to, $SiO_2$, silsesquioxanes, C doped oxides (i.e., organosilicates) that include atoms of Si, C, O and H, thermosetting polyarylene ethers, or multilayers thereof. When a multilayered interconnect dielectric material structure is employed, the various dielectric material layers are typically in direct contact with each other. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

In one embodiment, the dielectric layer 40 has a dielectric constant that is about 4.0 or less. In another embodiment, the dielectric layer 40 has a dielectric constant of about 2.8 or less. All dielectric constants mentioned herein are relative to a vacuum, unless otherwise noted. The dielectric layer 40 that is employed in the present disclosure generally has a lower parasitic crosstalk as compared with dielectric materials that have a dielectric constant of greater than 4.0. The thickness of the dielectric layer 40 can vary depending upon the dielectric material used as well as the exact number of dielectrics layers within the dielectric layer 40. Typically, and for normal interconnect structures, the dielectric layer 40 has a thickness from 50 nm to 1,000 nm.

The resists disclosed herein can be any resist. For example, the resists can include photoresists, electron-beam resists, ion-beam resists, X-ray resists, and etchant resists. The resist may a polymeric spin on material or a polymeric material. The first hard mask layer 16, the second hard mask layer 24, and/or the photoresist and pattern resist layer 26 can be removed by, for example, an ashing process.

The etching process employed to recess the semiconductor link 18 (e.g., SOI) can be any reactive ion etching (RIE) process. Non-limiting examples of etching processes include silicon etching methods selective to oxides.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

In the foregoing description, numerous specific details are set forth, such as particular structures, components, materials, dimensions, processing steps and techniques, in order to provide a thorough understanding of the present invention. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:
   depositing a first hard mask layer on a first substrate;
   lithographically patterning and etching the first substrate to form a semiconductor link connected to an anode semiconductor region and a cathode semiconductor region;
   removing the first hard mask layer from the first substrate;
   depositing a second hard mask layer on the first substrate;
   patterning a photoresist on the first substrate and etching to form an opening in the semiconductor link;
   etching to remove portions of the second hard mask layer to expose a portion of a sidewall of the semiconductor link;
   removing the photoresist from the first substrate and the semiconductor link; and
   recessing the sidewalls of the semiconductor link forming first anti-fuse tip and second anti-fuse tip to form an anti-fuse with an opening between the first and second anti-fuse tips, wherein the first hard mask layer and the second hard mask layer comprise a nitride;
   further comprising controlling the dimensions of a cavity formed by the etching such that a length, L', of the opening in the semiconductor link at a buried oxide layer disposed adjacent to the substrate is smaller than a lithographically limited length, L, of the opening at the first hard mask layer.

2. The method of claim 1, wherein the first substrate is a semiconductor on insulator substrate.

3. The method of claim 2, further comprising depositing a metal layer onto the first substrate, wherein the metal layer forms a semiconductor alloy with the material of the semiconductor link, the semiconductor cathode, the semiconductor anode, or a combination comprising at least one of the foregoing.

4. The method of claim 3, wherein the metal layer includes tungsten, tantalum, titanium, cobalt, nickel, platinum, or a combination comprising at least one of the foregoing.

5. The method of claim 3, further comprising annealing the anti-fuse to form a silicon silicide alloy layer on the first substrate and removing unreacted metal from the substrate.

6. The method of claim 4, further comprising depositing a dielectric layer, pattern contact via holes, and fill metal onto the silicon silicide alloy layer to form metal contacts configured to connect the anode semiconductor region and the cathode semiconductor region.

7. The method of claim 1, wherein the anti-fuse tips have a shape selected from triangular, pyramidal, or a combination comprising at least one of the foregoing.

8. The method of claim 1, wherein the anti-fuse further comprises a buried oxide layer adjacent to the first substrate.

9. The method of claim 7, wherein the anti-fuse further comprises a second substrate disposed adjacent to the buried oxide layer.

10. The method of claim 8, wherein the second substrate comprises silicon.

11. A method, comprising:
depositing a first hard mask layer on a first substrate;
lithographically patterning and etching the first substrate to form a semiconductor link connected to an anode semiconductor region and a cathode semiconductor region;
removing the first hard mask layer from the first substrate;
depositing a second hard mask layer on the first substrate;
patterning a photoresist on the first substrate and etching to form an opening in the semiconductor link;
etching to remove portions of the second hard mask layer to expose a portion of a sidewall of the semiconductor link;
removing the photoresist from the first substrate and the semiconductor link; and
recessing the sidewalls of the semiconductor link forming first anti-fuse tip and second anti-fuse tip to form an anti-fuse with an opening between the first and second anti-fuse tips, wherein the opening between the anti-fuse components is less than or equal to 5 nanometers, further comprising controlling the dimensions of a cavity formed by the etching such that a length, L', of the opening in the semiconductor link at a buried oxide layer disposed adjacent to the substrate is smaller than a lithographically limited length, L, of the opening at the first hard mask layer.

12. The method of claim 11, wherein the first substrate is a semiconductor on insulator substrate.

13. The method of claim 12, further comprising depositing a metal layer onto the first substrate, wherein the metal layer forms a semiconductor alloy with the material of the semiconductor link, the semiconductor cathode, the semiconductor anode, or a combination comprising at least one of the foregoing.

14. The method of claim 13, wherein the metal layer includes tungsten, tantalum, titanium, cobalt, nickel, platinum, or a combination comprising at least one of the foregoing.

15. The method of claim 13, further comprising annealing the anti-fuse to form a silicon silicide alloy layer on the first substrate and removing unreacted metal from the substrate.

16. The method of claim 14, further comprising depositing a dielectric layer, pattern contact via holes, and fill metal onto the silicon silicide alloy layer to form metal contacts configured to connect the anode semiconductor region and the cathode semiconductor region.

17. The method of claim 11, wherein the anti-fuse tips have a shape selected from triangular, pyramidal, or a combination comprising at least one of the foregoing.

18. The method of claim 11, wherein the anti-fuse further comprises a buried oxide layer adjacent to the first substrate.

19. The method of claim 18, wherein the anti-fuse further comprises a second substrate disposed adjacent to the buried oxide layer.

20. The method of claim 19, wherein the second substrate comprises silicon.

* * * * *